Feb. 25, 1958 S. B. SILVERSCHOTZ 2,825,010

METHOD AND MEANS FOR MOUNTING PRINTED CIRCUITS

Filed July 13, 1956

INVENTOR
STANFORD B. SILVERSCHOTZ
BY
Campbell, Brumbaugh, Free & Graves
HIS ATTORNEYS United States Patent Office 2,825,010

Patented Feb. 25, 1958

2,825,010

METHOD AND MEANS FOR MOUNTING PRINTED CIRCUITS

Stanford B. Silverschotz, New York, N. Y., assignor to Columbia Broadcasting System, Inc., New York, N. Y., a corporation of New York Application July 13, 1956, Serial No. 597,610

2 Claims. (Cl. 317—101)

This invention relates to methods and means for mounting electrical components and more particularly to a novel method and means for mounting on a chassis or other support insulated boards having so-called "printed circuits" formed thereon.

Printed circuits are coming into wide use in the electronics industry as components in television circuits and the like. In such applications, provision must be made for securely mounting the board or panel on which the circuit is formed on a chassis and for a reliable ground connection between the chassis and certain of the components of the printed circuit. The techniques and means utilized for this purpose heretofore have not been entirely satisfactory, either because assembly could not be effected with the degree of rapidity required in competitive manufacturing operations, or because the component could not be readily disassembled from the chassis for servicing, for example.

Accordingly, it is an object of the present invention to provide a method and means for mounting printed circuits rapidly and efficiently on a support such as a chassis, for example.

A further object of the invention is to provide a novel printed circuit mounting method and means which insures highly reliable electrical contact between an element in the printed circuit and the supporting base or chassis.

Another object of the invention is to provide novel printed circuit mounting means of the above character which enables the printed circuit to be readily disconnected from the chassis or support on which it is mounted.

These and other objects of the invention are attained by mounting a printed circuit board on a chassis or other support by means of a substantially U-shaped clip which is adapted to slip over an edge of a printed circuit board, the clip and the board having cooperating means retaining them releasably in assembled relation. The clip overlies and is in electrical contact with an element of the printed circuit, and a reliable electrical connection is insured by soldering the clip to this printed circuit element. The adjacent legs of the clip have registering apertures formed therein which register with an opening formed in the printed circuit board when the clip is assembled thereto. The printed circuit board is adapted to be mounted on a chassis or other support by providing a projecting element thereon which extends through the cooperating apertures in the clip, the outer end of which may be soldered or otherwise firmly secured to the adjacent leg of the clip.

It will be readily apparent that the structure and technique described briefly above provide secure mechanical support and highly reliable electrical contact between the chassis and the printed circuit, and at the same time afford the important advantages of ease and speed of assembly and disassembly.

Other objects and advantages of the invention will be apparent to those skilled in the art upon examination of the following detailed description, taken in conjunction with the accompanying drawings in which.

Figure 1:
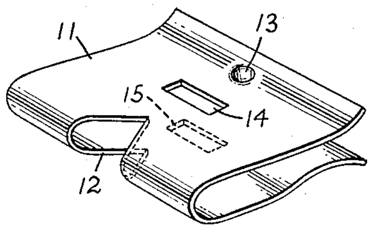
Fig. 1 is a perspective view of a mounting clip constructed according to the invention.

Referring now to Fig. 1, novel mounting means for mounting a printed circuit board on a chassis according to the invention includes a thin piece of electrically conductive resilient material formed in the shape of a clamp, such as the brass clip 11 illustrated in Fig. 1. The clip 11 is provided with locating means such as a V-slot 12 cut in the folded edge and a dimple 13 or other suitable projection in one leg and it has two apertures 14 and 15 formed in its opposite legs which are preferably in registry.

Figure 2:
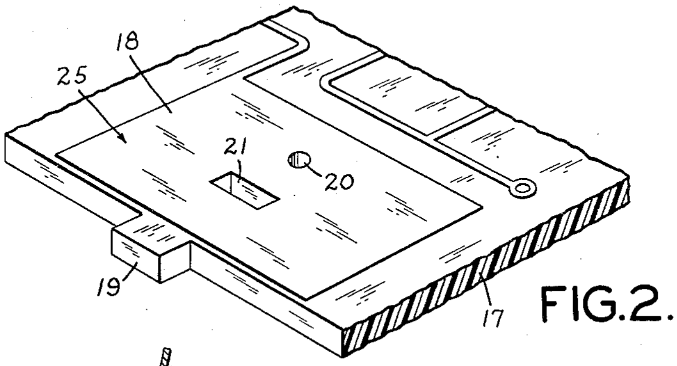
Fig. 2 is a partial view in perspective of a board on which there is printed an electrical circuit.

Fig. 2 shows a portion of a member to be supported which may be an insulated board 17 on which is formed a printed circuit of copper or other suitable material including a ground lead terminating in a conductive plate 18 somewhat larger in size than the clip shown in Fig. 1.

Figure 3:
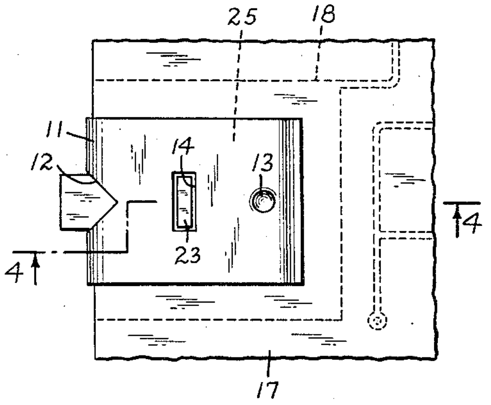
Fig. 3 is a plan view of the unprinted side of the board shown in Fig. 2, with the mounting clip assembled to it.

At about the middle of the edge of the plate 18 nearest an edge of the board 17 is formed an outwardly extending pojection or boss 19. Also, there are formed in the plate 18 and board 17 a locating hole 20 and an aperture 21, as illustrated in Fig. 3. The clip 11 is adapted to be clipped on the edge of the board 17 with the boss 19 extending through the V-slot 12 and with the dimple 13 in the hole 20, as shown in Fig. 3. In this position, the aperture 21 is aligned with the apertures 14 and 15 in the clip 11.

Figure 4:
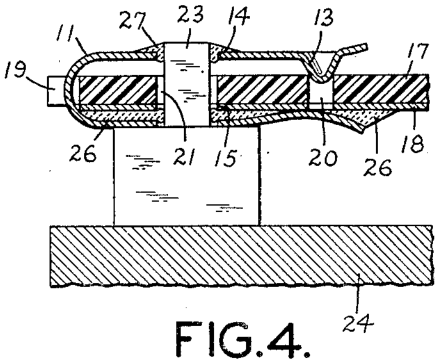
Fig. 4 is a sectional view taken along the line 4—4 of Fig. 3 looking in the direction of the arrows.

The rapid assembly of a printed circuit to a supporting chassis according to the invention is accomplished by placing the clip 11 on the board 17 so that the boss 19 engages the V-slot 12 and the dimple 13 snaps into the locating hole 20 in the manner shown in Figs. 3 and 4. Similarly, other clips may be located at various positions around the edge of the board 17 corresponding to the locations of other apertures, bosses, and locating holes.

Each of the clips 11 is secured to the corresponding copper plate 18 in any suitable manner as by dipping the board 17 with the clips in position into a bath of hot solder. In this fashion, the lower leg of each clip is rigidly secured to the plate 18 by the solder 26. The board 17 is then secured on the chassis 24 by positioning it thereon with the printed circuit facing the chassis 24, the mounting stud 23 projecting through the registering apertures 14, 15 and 21. The upper leg of each clip 11 is then soldered to the top of each corresponding stud 23 by the solder 27, as best seen in Fig. 4.

Figure 5:
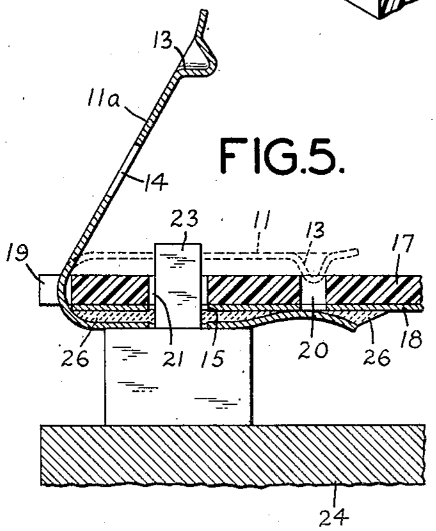
Fig. 5 is a sectional view illustrating how the mounting clip may be readily disassembled from the mounting stud.

It will be apparent that the technique and mounting means described above provide a permanent and secure mechanical support and reliable electrical grounding for printed circuits, while affording the advantages of simple and rapid assembly and disassembly of the printed circuit board 17 when necessary. Each clip 11 may be disconnected individually from the corresponding stud 23 merely by melting the solder fillet 27 at the top of each stud 23 and bending the arm of the associated clip away from the stud to the position 11*a*, as illustrated in Fig. 5. When all of the clips have been disconnected in this manner, the board 17 may be readily removed from the chassis 24 by lifting it away from the studs 23.

The invention herein described thus provides a novel and efficient method and means for the rapid and secure mounting of printed circuits and the like on a chassis or other support. By virtue of the novel structure described above, rapid and efficient assembly is possible while highly reliable electrical contact between the components of the circuit and the supporting chassis is assured.

It will be understood that the specific embodiment described above and illustrated in the accompanying drawings is not intended to be restrictive of the invention. On the contrary, various modifications will be apparent to those skilled in the art within the scope of the appended claims.

I claim:

1. In combination, an insulated board carrying a printed electrical circuit including a contact portion near one edge of said board, said board having an outwardly projecting portion at said one edge near said contact portion and first and second spaced apart apertures extending therethrough, a substantially U-shaped clip made of electrically conductive material mounted on said board at said one edge, said clip being provided with apertures in the opposite legs thereof registering with said first aperture in the board, and a positioning slot at the folded edge thereof through which said projecting portion of the board extends, means forming a depression in one of the legs of said clip extending into said second aperture in the board, a solder connection between one leg of the clip and said board contact portion, a chassis having an electrically conductive stud extending through the apertures in the legs of the clip and through said first aperture in the board, and a solder connection between said stud and the other leg of the clip.

2. In a method for mounting on chassis mounting studs an apertured board having a printed electrical circuit thereon including an electrically conductive contact area near one edge thereof, by means of a substantially U-shaped electrically conductive clip having opposite legs with registering apertures therein, the steps of positioning the clip with its legs embracing the board so that one leg of the clip is in electrical contact with the contact area of the printed circuit and the apertures of the clip are substantially aligned with the aperture in the board, soldering said one leg of the clip to the contact area of the printed circuit, inserting an electrically conductive chassis mounting stud into the registered apertures in the legs of the clip and in the board, and soldering the other leg of the clip to the mounting stud.

References Cited in the file of this patent

UNITED STATES PATENTS

| | | |
|---|---|---|
| 1,883,893 | Flaherty | Oct. 25, 1932 |
| 2,196,147 | Dunn | Apr. 2, 1940 |
| 2,542,793 | Brenta | Feb. 20, 1951 |

FOREIGN PATENTS

| | | |
|---|---|---|
| 515,597 | Great Britain | Dec. 8, 1939 |